United States Patent
Grund

(10) Patent No.: US 7,545,152 B2
(45) Date of Patent: Jun. 9, 2009

(54) TRANSMISSION LINE PULSE MEASUREMENT SYSTEM FOR MEASURING THE RESPONSE OF A DEVICE UNDER TEST

(75) Inventor: Evan Grund, San Jose, CA (US)

(73) Assignee: Thermo Fisher Scientific, Inc., Fremont, CA (US)

( * ) Notice: Subject to any disclaimer, the term of this patent is extended or adjusted under 35 U.S.C. 154(b) by 338 days.

(21) Appl. No.: 11/652,871

(22) Filed: Jan. 11, 2007

(65) Prior Publication Data

US 2007/0159186 A1    Jul. 12, 2007

Related U.S. Application Data

(60) Provisional application No. 60/758,248, filed on Jan. 11, 2006.

(51) Int. Cl.
   *G01R 31/11*    (2006.01)
   *G01R 27/06*    (2006.01)

(52) U.S. Cl. .................. 324/605; 324/765; 324/601; 324/158.1; 324/76.11

(58) Field of Classification Search .............. 324/605, 324/638, 637, 759, 678
See application file for complete search history.

(56) References Cited

U.S. PATENT DOCUMENTS

| | | | |
|---|---|---|---|
| 5,519,327 | A | 5/1996 | Consiglio |
| 5,804,977 | A | 9/1998 | Consiglio |
| 6,429,674 | B1 | 8/2002 | Barth et al. |
| 6,815,972 | B2 * | 11/2004 | Hsu .............................. 324/765 |
| 6,825,653 | B2 * | 11/2004 | Benes et al. ............... 324/158.1 |
| 6,998,833 | B2 * | 2/2006 | Wang et al. ................ 324/76.12 |
| 7,038,468 | B2 * | 5/2006 | Verspecht ..................... 324/638 |

OTHER PUBLICATIONS

Military Specifications, MIL-883E-Method, Electrostatic Discharge Sensitivity Classification, 6 pages, Mar. 22, 1989.
Automotive Electronics Council, AEC-Q101-REV-B, Stress Test Qualification for Discrete Semiconductors, 68 pages, Jul. 25, 2000.
Electrostatic Discharge (ESD) Association, ANSI/ESD STM5.1-2001, Human Body Model (HBM) Component Level, 17 pages, Mar. 20, 2003.

(Continued)

*Primary Examiner*—Timothy J Dole
*Assistant Examiner*—John Zhu
(74) *Attorney, Agent, or Firm*—Nixon Peabody LLP; Donald L. Bartels

(57) ABSTRACT

A Transmission Line Pulse ("TLP") measurement system for testing devices such as integrated circuits ("ICs"), and especially for testing the electrostatic discharge ("ESD") protection structures connected to terminals on such ICs. The TLP measurement system measures the pulsed voltage and/or current of a device under test ("DUT") by recording voltage and/or current pulse waveforms traveling in a constant impedance cable to and from the DUT. The pulses going to and returning from the DUT are processed to create signal replicas of the voltage and current pulses that actually occurred at the DUT. Oscilloscope operating settings optimize the recording of these signal replicas by improving the measurement signal-to-noise ratio. This improved TLP system is especially useful when very short width pulses on the order of less than 10 nanoseconds are used to test the DUT's response.

15 Claims, 2 Drawing Sheets

OTHER PUBLICATIONS

ESD Association, ANSI/ESD STM5-5.1-2008, Electrostatic Discharge Sensitivity Testing—Transmission Line Pulse (TLP)—Component Level, 25 pages, May 19, 2008.

Jeita, Eiaj ED-4701/300, Environmental and endurance test methods for semiconductor devices, 98 pages, Aug. 2001.

JEDEC Standard, Electrostatic Discharge (ESD) Sensitivity Testing Human Body Model (HBM), JESD22-A114C.01, 20 pages, Mar. 2005.

Gund, Evan, A Wafer Level HBM Tester Delivering Pulse with Variable Risetime through Transmission Lines, Proc. EOS/ESD Symposium, 7 pages, 2003.

* cited by examiner

US 7,545,152 B2

TRANSMISSION LINE PULSE MEASUREMENT SYSTEM FOR MEASURING THE RESPONSE OF A DEVICE UNDER TEST

CROSS REFERENCE TO RELATED APPLICATION

This application claims the benefit of U.S. Provisional Application No. 60/758,248, filed Jan. 11, 2006, which is incorporated herein by reference.

BACKGROUND OF THE INVENTION

1. Field of the Invention

This invention generally relates to systems that test integrated circuits and the like, and specifically relates to systems for measuring an integrated circuit's response to pulses generated by transmission line pulsers.

2. Description of the Related Art

It is useful to measure the ways integrated circuits ("ICs") respond to short high power pulses when evaluating their electrostatic discharge ("ESD") protection. The Transmission Line Pulse ("TLP") techniques described in the ESD Association Standard Practice ANSI/ESD SP5.5.1-2004, as well as in U.S. Pat. Nos. 5,519,327 and 6,429,674, are often used to make such measurements. Specifically, these techniques are designed to measure the ways ICs respond to current and voltage pulses that are delivered to them by a pulse generator or pulser. The TLP pulser delivers an initial, or incident, TLP pulse through a constant impedance cable to a selected terminal of an IC or other device under test ("DUT"). When the incident TLP pulse reaches the DUT, it is partly reflected by the DUT and new current and voltage pulse waveforms result. The reflected pulse overlaps with the incident pulse as it travels back up the constant impedance cable in the opposite direction, toward the pulser. The relative amplitudes of these incident and reflected pulses are determined by the dynamic impedance of the DUT. The study of a DUT's response to short high power pulses is a common goal of ESD studies. The constant impedance cable is designed in a manner known in the art to avoid significant pulse distortions, so that the reflected pulse may be accurately measured and the dynamic impedance of the DUT may be calculated by comparing the ratio of the incident and reflected pulses.

Prior art circuits for measuring the incident and reflected current and/or voltage pulse waveforms typically use current and/or voltage oscilloscope probes. These probes are positioned in the constant impedance cable at a selected insertion point where the incident and reflected pulses are expected to overlap, which means that the probes need to be positioned only a small distance from the DUT terminal. This approach is particularly useful because when the probes are able to measure the voltage and/or current levels of incident and reflected pulses at a point where the waveforms overlap, it enables measurements to be made that approximate the actual current and/or voltage levels that appear where the cable connects to the DUT terminal, which is the desired measurement point to fully determine the DUT's response. Additionally, there are also signal measurement techniques well known in the art that improve the accuracy of such measurements but they can only be applied when the pulses overlap.

It is known in the art that the actual pulse at the DUT terminal under test is the sum of the incident and reflected pulses, and prior art circuits and devices are not designed to take an actual measurement of these waveforms. This is because prior art circuits measure the waveforms' overlap when the waveforms are slightly displaced in time relative to each other. The waveforms are displaced at the measurement point because prior art designs place their oscilloscope probes a small distance from the DUT, as mentioned above, while the incident and reflected pulses only perfectly overlap at the exact point where the constant impedance cable connects to the DUT.

In other words, there will always be a time delay between the incident and reflected pulses when there is any length of cable between the oscilloscope probe and the DUT, and this is a characteristic of prior art devices. The time skew can be very short, but for some TLP measurements a delay as short as one nanosecond will cause measurement errors. This is especially true for cases where the total pulse length is on the order of a few nanoseconds, the skew becomes a significant part of the waveform.

DUT response to a TLP pulse can be divided into two time regions, the initial transient response and the steady state response after the transient has dissipated. Prior art TLP systems measure only the steady state response because the overlapped waveforms do not show the overlap of the transient response. When measuring the transient response of the DUT, the first nanosecond is often the most important waveform measurement. The actual DUT waveform thus cannot be recorded using the way in which prior art systems place oscilloscope probes in the constant impedance cable.

TLP waveforms are typically recorded with single-shot high-speed digital oscilloscopes. Computers then use the digitized waveform information collected by these oscilloscopes to determine steady state pulse time regions and to calculate the current and/or voltage levels at the DUT by averaging the data in those regions. Currently available oscilloscopes have dynamic ranges limited by their 8-bit analog-to-digital converters to 256 voltage levels and have typical noise levels of four or more least significant bits (limiting signal-to-noise ratios to <64:1). Data averaging improves this limited signal-to-noise ratio, but the resulting signal-to-noise ratio may be inadequate for some applications. Techniques known in the art have been developed to optimize oscilloscope measurements under computer control whereby the oscilloscope input amplifier gain is increased and oscilloscope offset adjustments made to shift the waveform, to zoom in and record the desired measurement region of the waveform.

With overlapped incident and reflected pulses, known prior art techniques have controlled oscilloscope gain and offset to improve the signal-to-noise ratio by ten fold. However, when an oscilloscope's digitization of DUT waveform measurements do not have an overlapped area, or when such overlapped area is small compared to the pulse width, these techniques may not be effective to improve the signal-to-noise ratio. Importantly, when TLP pulse widths are less than 10 nanoseconds (commonly termed Very Fast TLP or "VF-TLP"), very little, if any, overlap of incident and reflected pulses is possible at the measurement point in the constant impedance cable. Without overlap, the incident and reflected pulses are separately recorded and a computer calculates a mathematically generated estimate of the DUT's current and/or voltage waveforms.

The ESD Association Standard Practice ANSI/ESD SP5.5.1-2004 document describes several configurations of TLP. The most commonly used is the Time Domain Refection ("TDR") configuration. Most TLP systems produce 100 nanosecond-wide pulses. These systems employ oscilloscope measurement probes that usually capture the pulse signals where the incident and reflected pulses overlap in the constant impedance cable. This may be called "TDR-O," which stands for TDR with overlapped pulses. In contrast, there are TLP systems that measure "TDR-S," which is TDR using separated pulses where the constant impedance cable is long enough to hold the entire pulse length between the measurement point and the DUT. An advantage of measuring TDR-O is that the oscilloscope control system can optimize the vertical gain, adapting to the signal level of the best use of the oscilloscope's high-speed digitizer's dynamic range.

As previously mentioned, TLP using pulse widths of 10 nanoseconds or less is often called Very Fast TLP. Due to physical constraints of VF-TLP systems, the current and voltage measurement probes can not be placed close enough to the DUT terminal in the constant impedance cable to allow significant overlap of the incident and reflected pulses as required to make a useful TDR-O measurement. Therefore, TDR-S is the most commonly used configuration for VF-TLP. Unfortunately, oscilloscope gain adaptive gain control is very limited with TDR-S compared with TDR-O. What is needed is a circuit that converts TDR-S signals to TDR-O type signals and thereby resolve this measurement weakness.

A drawback of prior art techniques for measuring TDR-O signals is that, although the incident pulse and the reflected pulse overlap, but they are never fully overlapped. As the measurement probes cannot be placed exactly at the point where the transmission cable connects to the DUT terminal, there is always a finite time required for the incident pulse to travel from the measurement point to the DUT terminal. This same amount of time is required for a reflected pulse to travel from the DUT terminal to the measurement probe location. During this down and back travel time, the measurement probe records the incident pulse without the reflected pulse. Then the overlap period is measured, and finally the period where the reflected pulse does not overlap the incident pulse is recorded. Because the overlap is imperfect and the pulses are not perfectly rectangular, or flat topped, the actual DUT terminal current and/or voltage waveforms cannot be directly measured from the recorded signals. Information about the time-varying dynamic transient response of the DUT cannot be clearly established, either. A purpose of the present invention is to obtain fully overlapped pulses in order to provide recording of the undistorted DUT waveforms. These recordings provide both transient and steady state DUT response information.

Therefore, a need exits in the art of TLP systems that test the ESD protection of ICs to improve their measurement capabilities by producing a true replica of the DUT electrical signals as they exist at the DUT terminal under test, thereby enabling more accurate measurements of DUT responses to TLP pulses, including measurements of transient responses.

SUMMARY OF THE INVENTION

Accordingly, it is an object of the present invention to provide improved TLP systems for testing ICs and other devices, especially where there are ESD protection structures in such electronic parts. This invention is a TLP system that measures the current and/or voltage at a DUT terminal due to a pulse delivered through a constant impedance cable or a combination of cable and printed wiring board and measured at points within this constant impedance conduction path in a manner that compensates for the pulse delay caused by the travel time of the pulse from the measurement points to the DUT and back. In addition the new TLP system may include a high-speed oscilloscope and computer with gain optimizing software to improve the measurement's signal-to-noise ratio.

A component of the present invention is a circuit that splits the TDR-S signals into two signal paths. The longer path has a propagation delay that is equal to the shorter path plus twice the measurement probe to DUT propagation time. Signals from the two paths are then combined into a single signal. This combined signal contains separated replicas of three pulses: the incident pulse, followed by the sum of the incident and reflected pulses, further followed by the reflected pulse. The measurement of the current and/or voltage of the DUT can be made on the second pulse in the combined waveform as it is a replica of the DUT electrical waveforms.

Broadly stated the present invention is a pulse measurement circuit for measuring the response of an integrated circuit device or the like (a "DUT") to a pulse generated by a pulse generator wherein said pulse has a predetermined substantially constant voltage and pulse width, comprising: a conductor for coupling said pulse to a selected terminal of said DUT, said conductor having an approximately constant electrical impedance and an approximately constant pulse propagation velocity; a sensing probe connected to said conductor for generating an electrical signal in direct proportion to the current or voltage flowing in said conductor, said sensing probe positioned at an insertion point on said conductor where the propagation time from said insertion point to said DUT terminal is greater than the pulse width of said pulse multiplied by the propagation velocity of said conductor; a signal splitter for dividing the electrical signal from the said sensing probe into two approximately equal sub-signals and for coupling each said sub-signal to a separate output terminal; first and second signal delay paths each having an input end and an output end, each connected at its said input end to a respective one of said signal splitter output terminals, for delaying the propagation time of each said sub-signal a different predetermined amount; a signal combiner coupled to the output end of said first and second signal delay paths for combining said sub-signals into a single output signal; and a recorder for recording said output.

An object of the present invention is therefore to provide a signal to a recorder such as a high-speed oscilloscope that is a replica of the pulse generated by the TLP pulser as it exists at the DUT terminal under test.

These and other objects, features and advantages of the present invention will no doubt become apparent to those skilled in the art after reading the following detailed description of the preferred embodiments that are illustrated in the several accompanying drawings.

BRIEF DESCRIPTIONS OF THE DRAWINGS

The present invention can be better understood with reference to the attached drawings, which are incorporated in and form a part of this specification, and, together with the description, serve to explain the principles of the present invention. The components within the drawings are not necessarily to scale relative to each other, emphasis instead being placed upon clearly illustrating the principles of the present invention.

DETAILED DESCRIPTION OF THE PREFERRED EMBODIMENTS

The following description provides numerous specific details, such as the identification of various system components, and is designed to offer a thorough understanding of embodiments of the invention. One skilled in the art will recognize, however, that the invention can be practiced without one or more of the specific details, or with other methods, components, materials, etc. In still other instances, well-known structures, materials, or operations are not shown or described in detail to avoid obscuring aspects of various embodiments of the invention. Reference throughout this specification to "one embodiment" or "an embodiment" means that a particular feature, structure, or characteristic described in connection with the embodiment is included in at least one embodiment of the present invention. Thus, the appearance of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1:
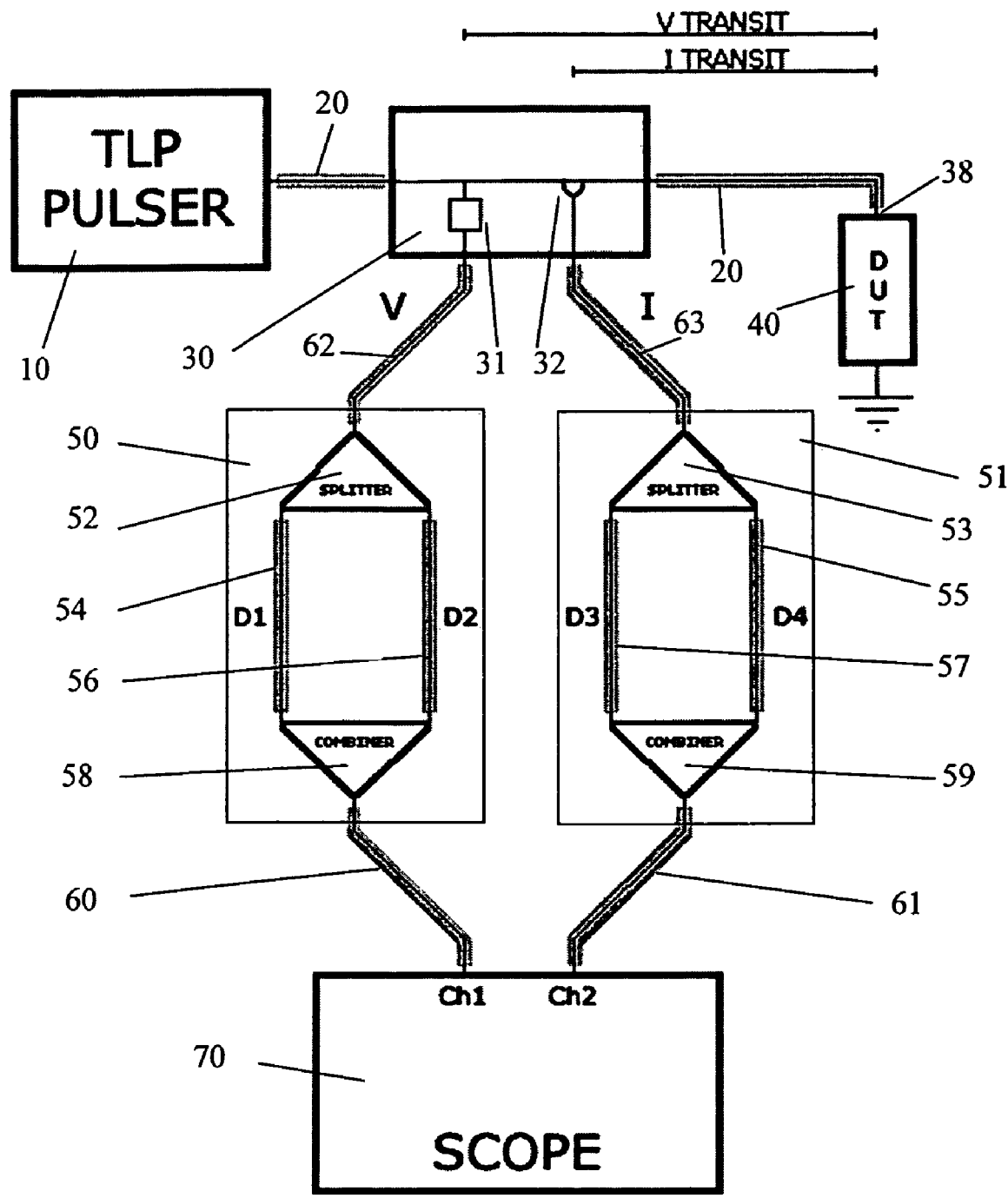
FIG. 1 is a schematic functional diagram of a transmission line pulse system for testing integrated circuits, including taking measurements of current and voltage signals that are processed by two adder circuits.

As shown in FIG. 1, a pulse is generated by a TLP pulser 10 and transmitted to an input terminal 38 of DUT 40 through a constant impedance path 20. Path 20 can comprise a conventional cable or other structure for coupling a pulse between two circuits or devices. A current and/or voltage sensing probe 30 is inserted into path 20 to produce signal(s) related to the pulse traveling in path 20. Where the DUT is a packaged IC, the IC is typically tested in an IC socket and sensing probe 30 is connected to one of the pins of the IC socket. A wafer probe can be used where the DUT is an unpackaged IC. The produced signal(s) detected by the sensing probe 30 are coupled to a pulse adder circuit 50 via a cable 62. The adder circuit according to the present invention is composed of 4 parts: a signal splitter 52, two delay cables 54 and 56, and a signal combiner 58. The lengths of 54 and 56 are made to have their propagation time difference be extremely close to twice the propagation time between the measurement point where probe 30 is inserted into path 20 and the terminal 38 of DUT 40. This produces a signal containing a sequence of pulses at the output of the combiner 58, the second pulse of which is a replica of the pulse that existed at terminal 38, the point where path 20 connects to DUT 40. This signal is transmitted by a cable 60 to a recorder 70, that is commonly a digital oscilloscope ("scope"). Recorder 70 can measure the replicated pulse, thereby determining the electrical conditions that were present at the terminal 38 of DUT 40. It is useful, but not necessary, to measure both current and voltage in such a manner. Due to the constant impedance of path 20, called Zo, the current and voltage at the connection of path 20 and terminal 38 of DUT 40 are related by Ohms law: $V_{DUT}=I_{DUT} \cdot Zo$. However, the measurement accuracy of the electrical parameters of the DUT is improved by measuring both current and voltage. Therefore, sensing probe 30 is preferably composed of voltage probe 31 and current probe 32 in this embodiment. In the preferred embodiment, a second sensing probe 32, and a second adder circuit 51, comprised of splitter 53, two delay cables 55, 57 and a signal combiner 59, function in an analogous manner as the components of adder circuit 50, with cables 56 and 57 having lengths as specified below. A cable 63 couples current sensing probe 32 to adder circuit 51 and a cable 61 transmits the signal from the output of 51 to a second input of 70. The reason a second adder circuit 51 is needed if both current and voltage signals are being measured at the same time is because the voltage and current sensing probes can not physically be inserted on path 20 at the same point because of their size. Consequently, the signal being sensed by each probe needs to be independently tuned by respective adder circuits 50 and 51 since the transit time of pulses between each probe and the terminal 38 of the DUT will be different.

More specifically, signals from both cables 60 and 61 are recorded by recorder 70 simultaneously. Having two measurements implies that there must be two different propagation times from probe 31 to DUT 40 and from probe 32 to DUT 40, as indicated in FIG. 1. Adjusting the cable lengths to provide proper delay times means that, with adder circuit 50 processing the voltage waveforms from voltage probe 31 and adder circuit 51 processing the current waveforms from current sensing probe 32, the delay times Dx through cables 54, 56, 55 and 57 can be calculated as follows:

$$D_1 \approx D_3 > 2 \cdot \text{PulseWidth}$$

$$D_2 = D_1 + 2 \cdot (V\text{Transit})$$

$$D_4 = D_3 + 2 \cdot (I\text{Transit})$$

where $D_1$ is the delay time through cable 54, $D_2$ is the delay time through cable 56, $D_3$ is the delay time through cable 57, $D_4$ is the delay time through cable 55, $V_{Transit}$ is the transit time from the voltage sensing probe 31 to terminal 38 of DUT 40, and $I_{Transit}$ is the transit time from the current sensing probe 32 to terminal 38 of DUT 40, as shown in FIG. 1. The signal delays should agree with the above formulas within an error of one-half the sampling interval of the digital scope or other recorder 70, to produce a valid replica of the DUT waveform for VF-TLP measurement. The specified delays provided by cables 54-57 need to be adjustable to the tens of picoseconds. This can be done using constant impedance delay lines that are adjustable in length. The present invention includes providing for the tuning of delay cable lengths to provide more exact timing delays.

Figure 2:
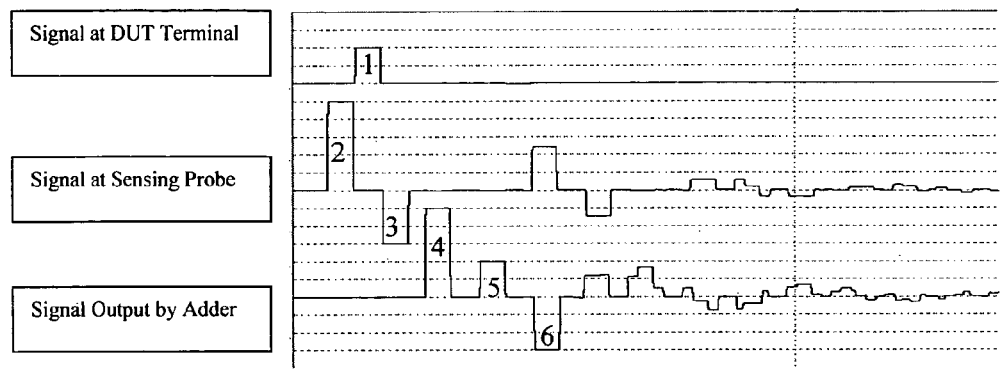
FIG. 2 is a time diagram of the signals produced by the TLP system that tested the circuits in FIG. 1.

FIG. 2 diagrams the output signal from adder 58 (or adder 59) that will be recorded by recorder 70 (the bottom trace) relative to the signals that were present at the point where path 20 connects to terminal 38 of DUT 40 (the top trace), and the signals generated by sensing probe 30 (the center trace).

Figure 3:
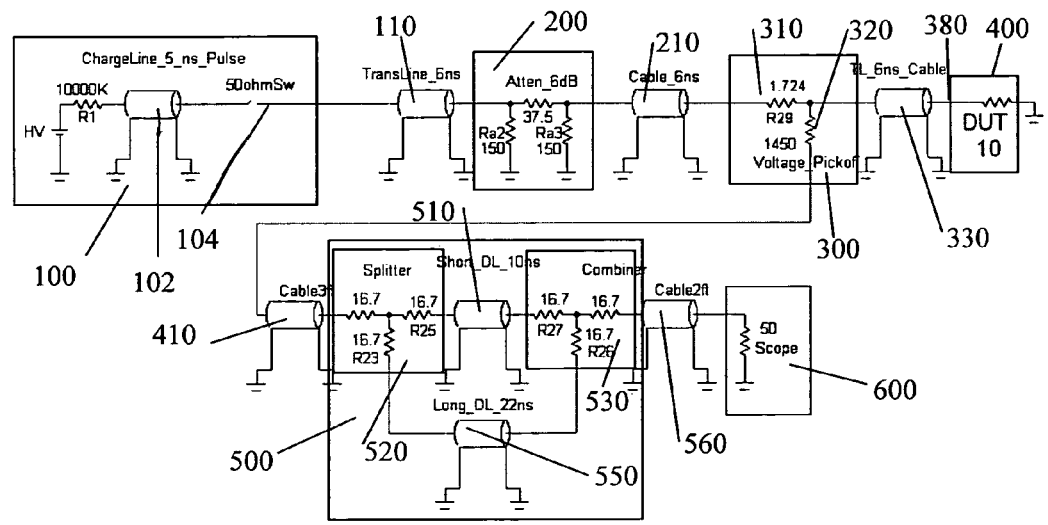
FIG. 3 is a detailed schematic of the preferred embodiment of the invention.

The preferred embodiment of the present invention is shown in the detailed schematic of FIG. 3. A TLP pulser 100 is shown with two main components: a high voltage supply to charge a transmission line 102 (shown as a 5 nanosecond charge line) and a normally open 50 ohm switch 104 that, when closed, will discharge the energy stored in the transmission line 102 into an output cable 110 as a TLP pulse. For example, if the high voltage supply provides 1000 volts to charge transmission line 103, when switch 104 closes, a 500 volt pulse having a pulse width of 10 nanoseconds will be coupled to transmission line 110. There are several variations for generating such pulses known to those skilled in the TLP art, and this is a simple example of one such pulser.

To reduce reflections that may cause undesirable multiple pulses, a resistive attenuator 200 is often inserted at some point into the pulse transmission path. The construction of components 110, 200, 210, 300 and 330 of resistive attenuator 200 are designed to maintain a constant impedance. The common impedance is 50 ohms for most high frequency circuits, but other impedances can be used. It is also possible to transform impedances along the pulse path with the use of impedance matching transformers. In a preferred embodiment, all of the components in the pulse measurement circuit should maintain some constant impedance. As is well known in the art, if a component can not be made a constant impedance, it needs to be physically small compared to the highest wavelength of interest.

The resistive attenuator 200 reduces reflections, making the source impedance driving cable 210 approximate the cable characteristic impedance, Zo, which is 50 ohms in the preferred embodiment. An exemplary fixed resistive attenuator 200 for reducing the power in pulse reflections, thereby lessening unwanted repetitive pulse stresses, is described in U.S. Pat. No. 6,429,674. Sensing probe 300 is a voltage pickoff probe in this example. Pulse detection with inductive current probes can also be used. Both voltage pickoff probes and inductive current probes may be used as in FIG. 1. For clarity, only the voltage pickoff probe has been shown in FIG. 3.

As seen in FIG. 3, voltage sensing probe 31 preferably comprises a voltage pickoff circuit 300. Circuit 300 includes a main line input terminal connected to cable 210, a main line output terminal connected to cable 330 and a signal output terminal connected to cable 410 and thereby to a pulse adder circuit 500. In the preferred embodiment, voltage pickoff circuit 300 is composed of two resistors. Resistor 320, with resistance $R_{320}$, forms a resistor divider with the cable 410 impedance. The signal output voltage attenuation of this embodiment equals the main line output voltage times $$\frac{Zo}{Zo + R_{320}} = \frac{50}{50 + 1450} = \frac{1}{30},$$

where Zo is the cable impedance of 410. Cables 410, 510, 550 and 560 are chosen in the preferred embodiment to equal the input impedance of the oscilloscope 600. The voltage signal output from circuit 300 that is coupled to adder circuit 500 is a replica of the main line voltage reduced by a factor of 30. The voltage pickoff circuit 300 also produces a replica of the reflected pulse. Resistor 310, with resistance $R_{310}$, is used to match the main line output impedance to cable 330, which is 50 ohms in this embodiment. If the mainline output impedance is not matched, the reflected pulse returning to the voltage pickoff circuit 300 will be reduced by a re-reflection. Resistance $R_{310}$ in this embodiment is selected by calculating $$R_{310} = \frac{Zo^2}{R_{320}} = \frac{2500}{1450} = 1.724 \text{ ohms.}$$

Those familiar with the art of voltage pickoff circuit designs will understand that two matching resistors are commonly used so as to create a symmetrical voltage pickoff. However, this common pickoff design will produce different voltage attenuations for the incident and reflected pulses. In a preferred embodiment of the present invention, by using resistance values for resistors 310 and 320 as described above, the voltage sensing probe is able to measure the incident and reflected pulse voltages with the same attenuation factor.

The signal entering adder circuit 500, as seen in FIG. 3, is split into two identical signals by a splitter 520, to produce two output pulses that are one-half the voltage of the original signal. This splitter 520 could also be a power divider composed of two 50-ohm resistors.

In the preferred embodiment, the splitter 520 and combiner 530 are of similar designs. Between splitter 520 and combiner 530 are pulse delay cables 510 and 550 of different lengths, to thereby create different predetermined pulse delays. Cable 510 is a cable having a delay time that is longer than the pulse width of the TLP pulses being used to test the DUT. In the preferred embodiment, the delay of cable 510 is twice the pulse width of the TLP pulse, which creates a space between the replicated incident pulse signal and the replicated DUT signal. Cable 550 provides a longer pulse delay that is equal to the length of the delay of cable 510 plus twice the pulse delay that exists between voltage pickoff circuit 300 and terminal 380 of DUT 400, the DUT under test (i.e., the delay provided by cable 550 needs to match the voltage probe to DUT pulse transit time plus the transit time of the reflected pulse back to the probe). As noted above, the time delays of cables 510 and 550 must be precisely set. In a preferred embodiment, cable 550 comprises the series combination of a fixed cable and a constant impedance variable delay line, where the variable delay line preferably has a resolution of 25 picoseconds or less.

The two different time-delayed TDR-S signals are added together at the opposite ends of cable 510 and 550 from splitter 520 by combiner 530. The preferred embodiment uses a matched impedance combiner 530 to add the signals. The output of the combiner 530 equals the sum of the signals from cables 510 and 550, reduced by a factor of one-half. The result is the signal shown in the bottom waveform of FIG. 2. The total attenuation of the signal through the adder circuit 500 is therefore preferably a factor of four.

Referring again to FIG. 2, the top trace in FIG. 2 shows pulse #1, the waveform at a terminal 380 of DUT 400. The center trace of FIG. 2 shows the signal from the voltage pickoff probe 300. This signal includes the incident pulse #2 from the pulser and the reflected pulse #3. Pulse #1 at terminal 380 of DUT 400 is the algebraic sum of pulses #2 and #3. The adder circuit 500 of FIG. 3 processes the measured waveform of the center trace, thereby producing the waveforms shown in the lower trace of FIG. 2. As seen in the lower trace of FIG. 2, the output of adder circuit 500 includes a pulse #4, which is replica of the incident pulse, followed by a pulse #5, which is a replica of the pulse at terminal 380 of DUT 400, further followed by a pulse #6, which is a replica of the reflected waveform from terminal 380 of DUT 400. After the three replica signals, there is a sequence of reflections generated in the adder circuit 500 that are of no consequence.

The sequence of pulses including the added signal, or pulse #5 of FIG. 2, is delivered to the digital oscilloscope 600 by cable 560. This second pulse in this waveform is of special interest as it is a replica of the voltage at the pulsed DUT terminal 380. In the preferred embodiment, the vertical gain of scope 600 is set so that pulse #5 is digitized by scope 600 at half of the total voltage range of the scope 600. This allows the vertical gain and offset to be set to use at least one-half of the scope's dynamic range in the recording of the replica of the DUT voltage, to thereby provide a low noise measurement. A computer algorithm may be used to set the gain and offset of the scope based on previous analogous measurements.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A pulse measurement circuit for measuring the response of a device under test (DUT) to a pulse generated by a pulse generator wherein said pulse has a predetermined substantially constant voltage and pulse width, comprising:
   a conductor for coupling said pulse to a selected terminal of said DUT, said conductor having an approximately constant electrical impedance and an approximately constant pulse propagation velocity;
   a sensing probe connected to said conductor for generating an electrical signal in direct proportion to the current or voltage flowing in said conductor, said sensing probe positioned at an insertion point on said conductor where the propagation time from said insertion point to said DUT terminal is greater than the pulse width of said pulse multiplied by the propagation velocity of said conductor;
   a signal splitter for dividing the electrical signal from the said sensing probe into two approximately equal sub-signals and for coupling each said sub-signal to a separate output terminal;
   first and second signal delay paths each having an input end and an output end, each connected at its said input end to a respective one of said signal splitter output terminals, for delaying the propagation time of each said sub-signal a different predetermined amount;
   a signal combiner coupled to the output end of said first and second signal delay paths for combining said sub-signals into a single output signal; and
   a recorder for recording said output signal.

2. The circuit of claim 1 wherein said conductor comprises a series of conduction paths with each member of this series being of approximately constant electrical impedance.

3. The circuit of claim 2 wherein all members of said series of conduction paths have approximately the same electrical impedance.

4. The circuit of claim 1 wherein recorder both records and displays the transient response of said DUT in response to said pulse.

5. The circuit of claim 1 wherein said recorder both records and displays the steady state response of said DUT in response to said pulse.

6. The circuit of claim 1 where the said recorder is an oscilloscope.

7. The circuit of claim 6 wherein a series of pulses are coupled to said DUT and wherein said recorder further comprises a computer for storing and analyzing the output signals generated in response to said pulses.

8. The circuit of claim 7 wherein said computer controls said oscilloscope's gain and offset.

9. The circuit of claim 8 wherein said computer controls the gain and offset setting of each measurement channel of said oscilloscope by optimizing said settings based on previously recorded output signals.

10. The circuit of claim 8 wherein said computer controls oscilloscope gain and offset settings for each measurement channel based on an extrapolation of previous measurements to record the output signal at approximately the center of the oscilloscope's dynamic range.

11. The circuit of claim 1 wherein said delay paths have signal delays that are unequal in their signal propagation time in an amount equal to twice the propagation time of a pulse traveling from said sensing probe to said DUT in said conductor.

12. The circuit of claim 11 wherein either or both of said pair of signal delay paths is composed of a series of signal paths with each member of such series being of approximately the same constant electrical impedance; and
   wherein a member of said series of signal paths includes a delay path having a adjustable signal delay.

13. The circuit of claim 1 wherein said sensing probe comprises a first resistor connected in series with said conductor, and a second resistor connected between the terminal of the first resistor closest to said DUT and said signal splitter, where the first resistor's resistance is approximately equal to $$\frac{Z_o^2}{R_2 + Z_i - Z_o},$$

where $Z_o$ is the impedance of said conductor, $R_2$ is the resistance of the second resistor, and $Z_i$ is the input impedance of said signal splitter.

14. The circuit of claim 1 wherein the impedance of said first and second signal delay paths is approximately equal to the input impedance of said recorder.

15. A pulse measurement circuit for measuring the response of an integrated circuit device or the like (a "DUT") to a pulse generated by a pulse generator wherein said pulse has a predetermined substantially constant voltage and pulse width, comprising:
   a conductor for coupling said pulse to a selected terminal of said DUT, said conductor having an approximately constant electrical impedance and an approximately constant pulse propagation velocity;
   a sensing probe connected to said conductor for generating an electrical signal in direct proportion to the current or voltage flowing in said conductor, said sensing probe positioned at an insertion point on said conductor where the propagation time from said insertion point to said DUT terminal is greater than the pulse width of said pulse multiplied by the propagation velocity of said conductor;
   a signal splitter for dividing the electrical signal from the said sensing probe into two approximately equal sub-signals and for coupling each said sub-signal to a separate output terminal;
   first and second signal delay paths each having an input end and an output end, each connected at its said input end to a respective one of said signal splitter output terminals, wherein the propagation delay time of said second signal delay path is longer than the propagation delay time of said first signal delay path by twice the pulse propagation time of a pulse traveling on said conductor between said sensing probe and said DUT terminal;
   a signal combiner coupled to the output end of said first and second signal delay paths for combining said sub-signals into a single output signal; and
   a recorder for recording said output signal.

* * * * *